(12) United States Patent
Funada et al.

(10) Patent No.: US 7,501,581 B2
(45) Date of Patent: Mar. 10, 2009

(54) WIRED CIRCUIT BOARD AND PRODUCING METHOD THEREOF

(75) Inventors: Yasuhito Funada, Osaka (JP); Jun Ishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 69 days.

(21) Appl. No.: 11/634,868

(22) Filed: Dec. 7, 2006

(65) Prior Publication Data

US 2007/0131449 A1 Jun. 14, 2007

(30) Foreign Application Priority Data

Dec. 8, 2005 (JP) .............................. 2005-355089

(51) Int. Cl.
*H05K 1/00* (2006.01)
(52) U.S. Cl. ..................... 174/254; 360/245.9
(58) Field of Classification Search ................. 174/254, 174/255, 260; 360/245.9
See application file for complete search history.

(56) References Cited

U.S. PATENT DOCUMENTS

| | | | | |
|---|---|---|---|---|
| 6,057,986 A * | 5/2000 | Takasugi | .................. | 360/245.9 |
| 6,609,297 B1 * | 8/2003 | Hiramatsu et al. | ............ | 29/852 |
| 6,735,052 B2 * | 5/2004 | Dunn et al. | ............... | 360/245.9 |
| 6,801,402 B1 * | 10/2004 | Subrahmanyam et al. | ........................ | 360/245.9 |
| 7,319,573 B2 * | 1/2008 | Nishiyama | ............... | 360/245.9 |
| 2004/0252413 A1 | 12/2004 | Nishiyama | | |

FOREIGN PATENT DOCUMENTS

JP 2005-11387 1/2005

\* cited by examiner

*Primary Examiner*—Ishwar (I. B.) Patel
(74) *Attorney, Agent, or Firm*—Jean C. Edwards, Esq.; Akerman Senterfitt

(57) ABSTRACT

A wired circuit board and a producing method thereof are provided which can precisely form an insulating layer and reduce transmission loss with a simple layer structure and also features excellent long-term reliability by preventing the occurrence of an ion migration phenomenon between a ground layer and a positioning mark layer, and the insulating layer to improve the adhesion therebetween and the conductivity of a conductor. A metal supporting board is prepared and a first metal thin film is formed on the metal supporting board. A resist is formed in a pattern and a ground layer and a positioning mark layer are formed on the first metal thin film exposed from the resist at the same time. A second metal thin film is formed over the ground layer and the positioning mark layer, then the resist is removed. An insulating base layer is formed on the first metal thin film including the upper surface of the second metal thin film, thereafter, a conductive pattern is formed on the insulating base layer.

4 Claims, 3 Drawing Sheets

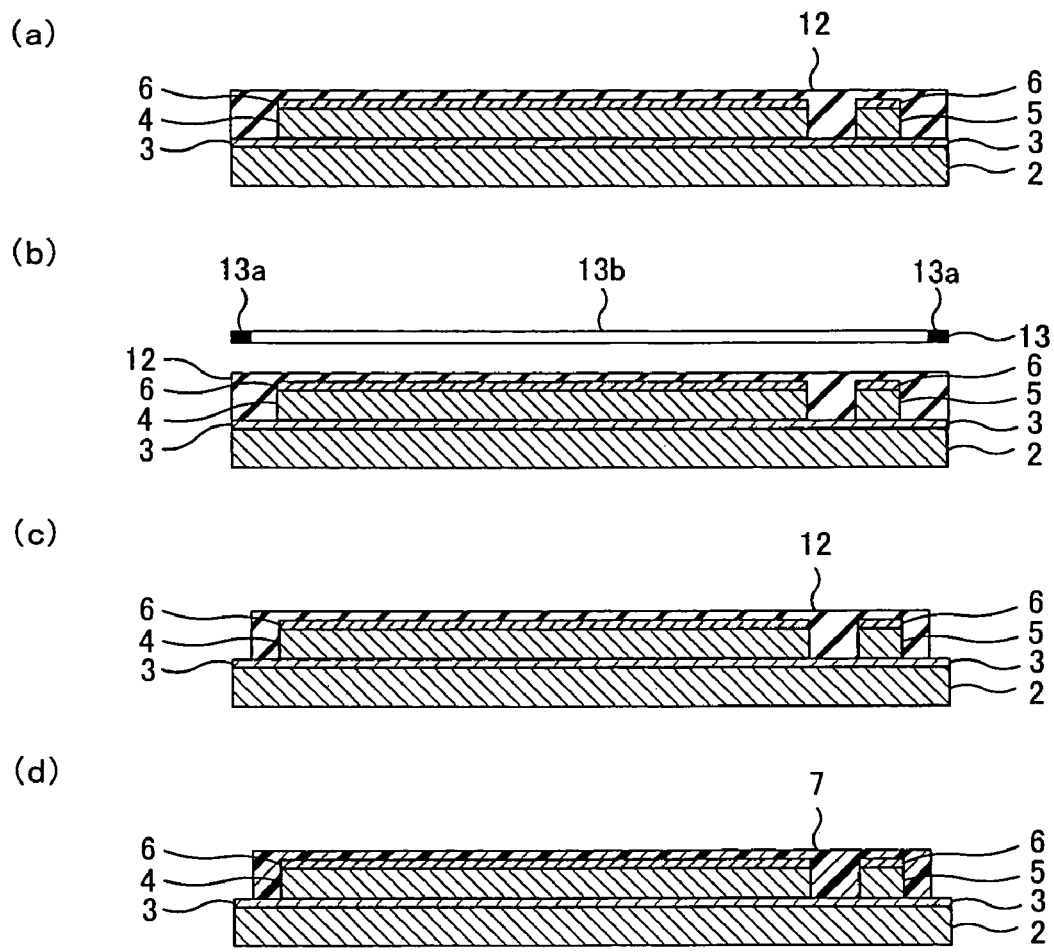

WIRED CIRCUIT BOARD AND PRODUCING METHOD THEREOF

CROSS REFERENCE TO RELATED APPLICATION

This application claims priority benefits on the basis of Japanese Patent Application No. 2005-355089 filed on Dec. 8, 2005, the disclosure of which is incorporated herein by reference.

BACKGROUND OF THE INVENTION

1. Field of the Invention

The present invention relates to a wired circuit board and a method of producing the same, more particularly, to a wired circuit board including, for example, a suspension board with circuit and the like and a producing method thereof.

2. Description of the Prior Art

There has been conventionally known a suspension board with circuit including a metal supporting board made of stainless steel, an insulating layer made of a resin, and a conductive pattern made of copper, which are formed successively on the metal supporting board.

In such a suspension board with circuit, a metal supporting board is made of stainless steel, so that a transmission loss is increased in a conductive pattern.

To reduce the transmission loss, it has been proposed that a lower conductor made of copper or a copper alloy containing mainly copper is formed on a suspension made of stainless steel and then an insulating layer, a conductor on the recording side and a conductor on the playback side are successively formed on the lower conductor (see, e.g., Japanese Unexamined Patent Publication No. 2005-11387).

However, in the proposal mentioned above, the insulating layer is formed directly on the lower conductor so that an ion migration phenomenon occurs in which the copper or the copper alloy containing mainly copper of the lower conductor migrates to a surface of the insulating layer or to the inner portion thereof with moisture or water absorption by the insulating layer in the presence of an electric current or voltage. This occasionally causes defective adhesion between the lower conductor and the insulating layer or defective conductivity of the conductors on the recording and playback sides.

When the insulating layer is formed on the lower conductor in the form of a pattern by exposing the photosensitive synthetic resin to light and developing it, an exposure mask must be disposed precisely on the upper portion of the lower conductor, thereby requiring a positioning mark provided on the suspension board.

In order to precisely detect the positioning mark, since it is optically detected, an optically distinguishable contrast is required between the surface of the positioning mark and the surface around the positioning mark.

SUMMARY OF THE INVENTION

It is therefore an object of the present invention to provide a wired circuit board and a producing method thereof which can precisely form an insulating layer and reduce transmission loss with a simple layer structure and also features excellent long-term reliability by preventing the occurrence of an ion migration phenomenon between each of a ground layer and a positioning mark, and an insulating layer to improve the adhesion between each of the ground layer and a positioning mark, and the insulating layer and the conductivity of a conductor.

The present invention provides a novel wired circuit board comprising a metal suspension board, a first thin metal film formed on the metal suspension board, a ground layer and a positioning mark layer formed on the first thin metal film, a second thin metal film formed on the ground layer and the positioning mark layer, an insulating layer formed on the second thin metal film, a conductive pattern formed on the insulating layer.

In the wired circuit board of the present invention, it is preferable that the ground layer and the positioning mark layer are formed of copper and the second thin metal film is formed of nickel.

The method of producing the wired circuit board of the present invention comprises the steps of; preparing a metal suspension board; forming a first thin metal film on the metal suspension board; forming a resist on the first thin metal film to have a pattern; forming a ground layer and a positioning mark layer on the first thin metal film exposed from the resist; forming a second thin metal film on the ground layer and the positioning mark layer and removing the resist; forming an insulating layer on the second thin metal film; and forming a conductive pattern on the insulating layer.

In the method of producing the wired circuit board of the present invention, it is preferable that the positioning mark layer is formed of copper and the second thin metal film is formed of nickel.

The wired circuit board according to the present invention can precisely form the insulating layer and reduce transmission loss with a simple layer structure. Moreover, since the second metal thin film is formed between each of the ground layer and the positioning mark layer, and the insulating layer, the occurrence of the ion migration phenomenon between each of the ground layer and the positioning mark layer, and the insulating layer is prevented with the simple layer structure. As a result, it is possible to sufficiently improve the adhesion between each of the ground layer and the positioning mark layer, and the insulating layer as well as the conductivity of the conductor to ensure excellent long-term reliability.

In addition, according to the method of producing the wired circuit board of the present invention, the positioning mark layer and the ground layer can be formed on the first thin metal film at the same time. Since the second thin metal film is formed on the ground layer and the positioning mark layer, and then the resist is removed, therefore, in the process of forming the insulating layer, the second thin metal film is formed on the ground layer and the positioning mark layer, whereas the first thin metal film is exposed in the portion other than above. This ensures to make an optically distinguishable contrast between the second thin metal film formed on the positioning mark layer and the first thin metal film exposed therearound. As a result, the positioning mark can be accurately detected and thus the insulating layer can be in the insulating layer forming process.

BRIEF DESCRIPTION OF THE DRAWINGS

FIG. 4 is a production process drawing showing the details of the step of forming the insulating base layer on the second thin metal film shown in FIG. 3, (a) showing the step of forming a coating of a precursor of photosensitive polyimide resin over the entire surface of the second thin metal film, (b) showing the step of optically detecting the positioning mark layer, providing an exposure mask on the upper portion of the coating, and exposing to light through the exposure mask, (c) showing the step of developing the coating, and (d) showing the step of curing the coating and forming the insulating base layer of polyimide resin.

DETAILED DESCRIPTION OF THE PREFERRED EMBODIMENT

Figure 1:
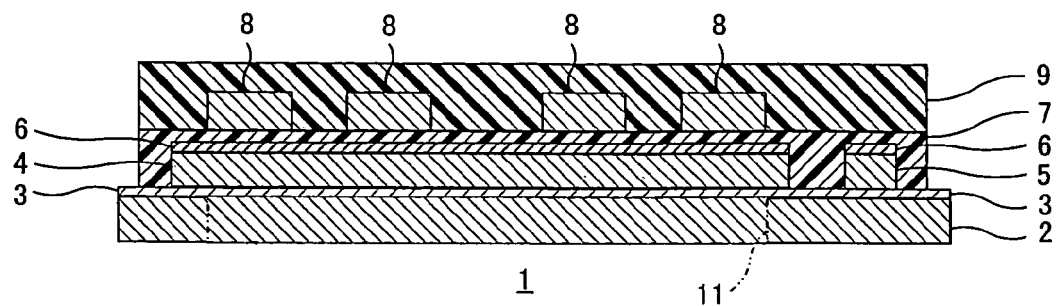
FIG. 1 is a sectional view of a principal portion of a wired circuit board of an embodiment of the present invention.

FIG. 1 is a sectional view of a principal portion of a wired circuit board according to an embodiment of the present invention.

In FIG. 1, a wired circuit board 1 is a suspension board with circuit which is mounted in a hard disk drive and comprises a first metal thin film 3 formed on a metal supporting board 2 extending in a longitudinal direction, a ground layer 4 and a positioning mark layer 5 formed on the first metal thin film 3, a second metal thin film 6 formed on the ground layer 4 and the positioning mark layer 5, an insulating base layer 7 formed on the second metal thin film 6 and a conductive pattern 8 formed on the insulating base layer 7. The wired circuit board 1 comprises an insulating cover layer 9 formed on the conductive pattern 8 as necessary.

The metal supporting board 2 is made of metal foil or a metal thin plate in the form of a flat plate. Examples of the metal used to form the metal supporting board 2 include stainless steel and a 42-alloy. Preferably, stainless steel is used. The thickness of the metal supporting board 2 is in the range of, e.g., 15 to 30 μm or preferably 20 to 25 μm.

The first metal thin film 3 is formed in a pattern on a surface (upper surface) of the metal supporting board 2 to face at least the portion over which the ground layer 4 and the positioning mark layer 5 are formed. Examples of the metal used to form the first metal thin film 3 include chromium, gold, silver, platinum, nickel, titanium, silicon, manganese, zirconium, and alloys thereof, or oxides thereof. The thickness of the first metal thin film 3 is in the range of, e.g., 0.01 to 1 μm or preferably 0.1 to 1 μm.

The first metal thin film 3 can also be formed to have a multilayer structure in consideration of the adhesion between the metal supporting board 2 and the ground layer 4 and the positioning mark layer 5 in such a manner that, e.g., a first layer of the first metal thin film 3 which is made of a metal having excellent adhesion to the metal supporting board 2 is formed on a surface of the metal supporting board 2, and then a second layer of the first metal thin film 3 which is made of a metal having excellent adhesion to the ground layer 4 and the positioning mark layer 5, is formed in laminated relation on a surface of the first layer of the first metal thin film 3.

The upper most surface of the first thin metal film 3 is formed of metals that are different from the metals of the second thin metal film 6 to be described later. Of these metals, copper is preferably used.

The ground layer 4 is formed in a pattern on a surface (upper surface) of the first metal thin film 3 to face at least the portion over which the conductive pattern 8 is formed. As an example of the metal for forming the ground layer 4, copper is preferably used. The thickness of the ground layer 4 is in the range of, e.g., 0.5 to 5 μm or preferably 2 to 5 μm.

The positioning mark layer 5 is formed in a pattern and formed on a surface (upper surface) of the first thin metal film 3, at any portion except where the ground layer 4 is formed, i.e., at one side end in a widthwise direction (a direction orthogonal to the longitudinal direction) of the wired circuit board 1 to the ground layer 4. As an example of the metal for forming the positioning mark layer 5, copper is preferably used. The thickness of the positioning mark layer 5 is in the range of e.g. 0.5 to 7.0 μm, or preferably 2 to 5 μm. The shape of the positioning mark layer 5 is not limited to, however, e.g., elliptic shape as seen from top. The size of the positioning mark layer 5 is in the range of, e.g. 100 to 1000 μm, or preferably, 200 to 700 μm.

The second metal thin film 6 is formed on each surface (upper surface) of the ground layer 4 and the positioning mark layer 5 to cover each of the ground layer 4 and the positioning mark layer 5. To form the second metal thin film 6, the same metal as used to form the first metal thin film 3 shown above may be used. However a metal different from those used for the first metal thin film 3 may be used, and nickel is preferably used. The thickness of the second metal thin film 6 is, e.g., not more than 3 μm, preferably not more than 0.5 μm, and normally not less than 0.1 μm.

The insulating base layer 7 is on the second thin metal film 6, more specifically, the insulating base layer 7 is formed on the surface of the first thin metal film 3 to cover the surfaces (top and sides) of the second thin metal film 6, and each side of the ground layer 4 and the positioning mark layer 5. As the insulator for forming the insulating base layer 7, a synthetic resin normally used as an insulator for a wired circuit board is used. Examples of the synthetic resin include polyimide, polyethernitrile, polyethersulfone, polyethylene terephthalate, polyethylene naphthalate, and polyvinyl chloride. Among these examples, a photosensitive synthetic resin is preferably used. More preferably, photosensitive polyimide is used. The thickness of the insulating base layer 7 is in the range of, e.g., 5 to 15 μm and preferably 8 to 10 μm.

The conductive pattern 8 is formed on a surface of the insulating base layer 7 as a wired circuit pattern comprising a plurality of wires lines (e.g., four wires) extending longitudinally which are arranged in parallel and spaced apart from each other. As the conductor for forming the conductive pattern 8, a metal normally used as a conductor for a wired circuit board is used. Examples of the metal include copper, nickel, gold, a solder, and alloys thereof. Among these examples, copper is preferably used. The thickness of the conductive pattern 7 is in the range of, e.g., 5 to 20 μm or preferably 7 to 15 μm. The width of each of the wires is in the range of, e.g., 10 to 100 μm or preferably 20 to 50 μm. The spacings between the individual wires are in the range of, e.g., 10 to 100 μm and preferably 20 to 50 μm.

The insulating cover layer 9 is formed on the surface of the insulating base layer 7 to cover the conductive pattern 8. To form the insulating cover layer 9, the same insulator as used to form the insulating base layer 7 shown above is used. The thickness of the insulating cover layer 8 is in the range of, e.g., 3 to 15 μm and preferably 4 to 5 μm.

Figure 3:
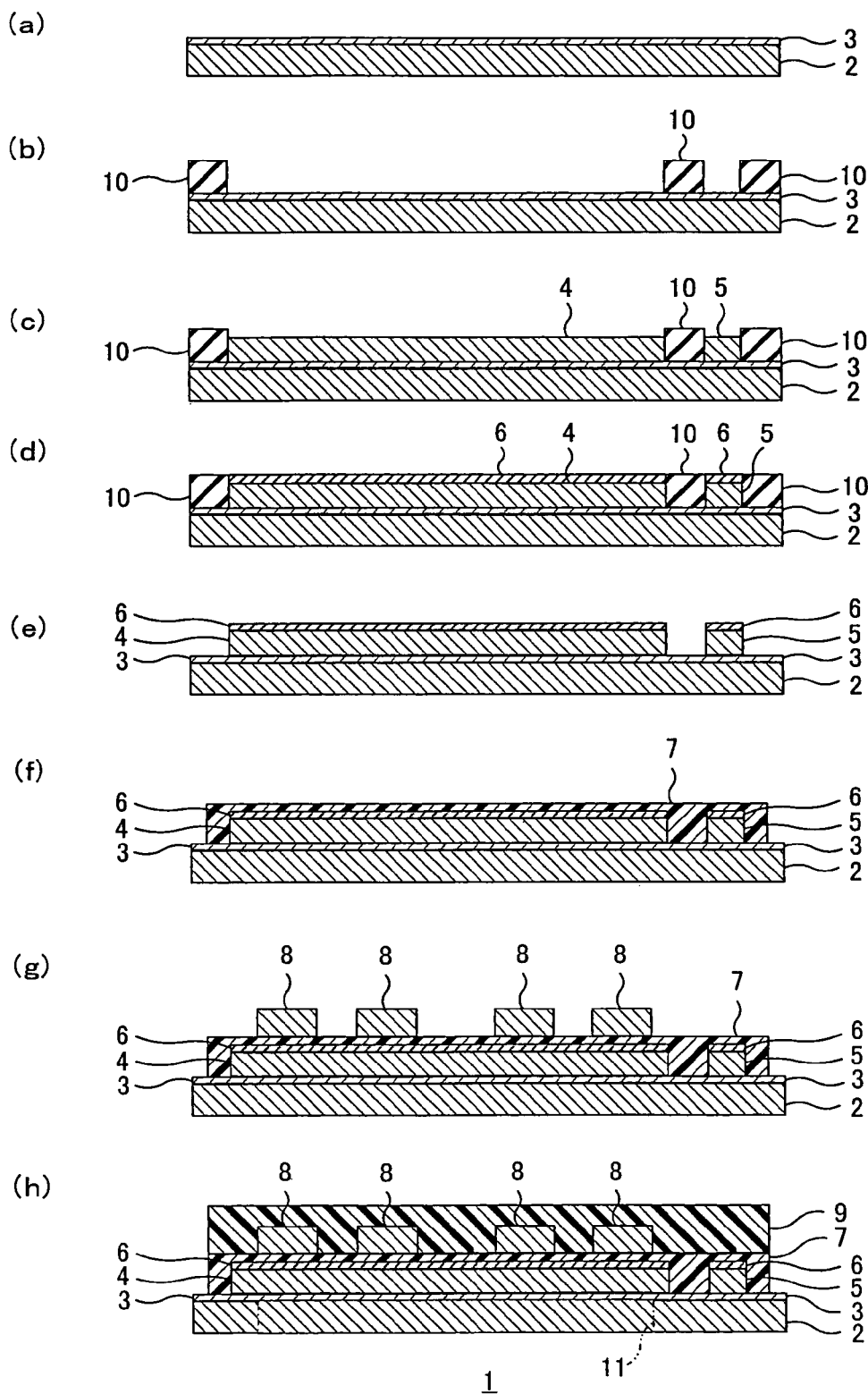
FIG. 3 is a production process drawing showing a production method of the wired circuit board shown in FIG. 1, (a) showing the step of forming a first thin metal film on a metal suspension board by sputtering or by electrolytic plating, (b) showing the step of forming a resist having a reverse pattern to a pattern of each of a ground layer and a positioning mark layer, (c) showing the step of forming the ground layer and the positioning mark layer on the first thin metal film exposed from the resist by electrolytic plating, (d) showing the step of forming a second thin metal film on the ground layer and the positioning mark layer exposed from the resist by electroless plating, (e) showing the step of removing the resist, (f) showing the step of forming an insulating base layer on the second thin metal film, (g) showing the step of forming a conductive pattern on the insulating base layer, and (h) showing the step of forming an insulating cover layer on the insulating base layer to cover the conductive pattern.

The wired circuit board 1 shown in FIG. 1 can be produced in accordance with the method illustrated in, e.g., FIG. 3 and FIG. 4.

First, as shown in FIG. 3(a), the metal supporting board 2 is prepared and the first metal thin film 3 is formed on the entire surface of the metal supporting board 2 by sputtering or electrolytic plating.

Then, as shown in FIG. 3(b), a resist 10 is formed in a pattern reverse to each pattern of the ground layer 4 and the positioning mark layer 5 mentioned above. The resist 10 is formed by a known method which involves, e.g., exposure to light and development using a dry film resist.

Next, as shown in FIG. 3(c), the ground layer 4 and the positioning mark layer 5 are formed at the same time on the entire surface of the portion of the first metal thin film 3 exposed from the resist 10 by electrolytic plating, preferably electrolytic copper plating, using the resist 10 as a plating resist.

Then, as shown in FIG. 3(d), the second thin metal film 6 is formed on the each surface (upper surface) of the ground layer 4 and the positioning mark layer 5 exposed from the resist 10 by electroless plating, or preferably by non-electrolytic nickel plating.

Then, as shown in FIG. 3(e), the resist 10 is removed by e.g. a known etching process, such as a chemical etching (wet etching), or by peeling, whereby the second thin metal film 6 is formed on the upper surfaces of the ground layer 4 and the positioning mark layer 5. And at the same time, the first thin metal film 3 is exposed on the surface of the metal suspension board 2 except where the second thin metal film 6 is formed.

Then, as shown in FIG. 3(f), the insulating base layer 7 is formed on the entire surface of the first thin metal film 3 to cover the upper surface of the second thin metal film 6, and the side surface of each of the ground layer 4 and the positioning mark layer 5.

More specifically, when the insulating base layer 7 is formed in a pattern using photosensitive polyimide resin, for example, as shown in FIG. 4(a), the solution of precursor (photosensitive polyamic acid resin) of photosensitive polyimide resin is coated on the entire surface of the first thin metal film 3 to cover the surface of each of the second thin metal film 6, the side surfaces of the ground layer 4 and the positioning mark layer 5 and, then, is heated in the range of e.g., 60 to 150° C., or preferably, 80 to 120° C. to form a coating 12 of a precursor of photosensitive polyimide resin.

Next, as shown in FIG. 4(b), the positioning mark layer 5 is detected by an optical sensor and, with reference to the detected positioning mark 5, an exposure mask 13 is provided above the coat 12. The coating 12 is exposed to light through the exposure mask 13. The exposure mask 13 has a pattern of a light blocking portion 13a and a full light transmission portion 13b.

In the case where a negative type is used to form a pattern, the exposure mask 13 is disposed to face the coating 12, so that the light blocking portions 13a face portions in the first thin metal film 3 where the insulating base layer 7 is not formed, and so that the full light transmission portions 13b face portions in the first thin metal film 3 where the insulating base layer 7 is formed.

The light to be irradiated through the exposure mask 13 (irradiation) has an exposure wavelength in the range of, e.g., 300 to 450 nm, preferably, 350 to 420 nm, and has an accumulated amount of exposure light in the range of 100 to 2000 mJ/cm$^2$.

Then, the exposed coating 12 is heated to a predetermined temperature on an as-needed basis and developed. The irradiated exposure portion of the coating 12 is insolubilized (in the case of negative type) in the following developing process by heating in the range of, e.g., 150° C. or higher and 200° C. or lower.

In the developing process, a known process such as dipping or spraying may be used using a known developer such as an alkaline developer. In such process, it is preferable to use a negative type to form a pattern, and the pattern is formed using the negative type in FIG. 4.

By this developing process, in the coating 12, the peripheral portion to which the light blocking portion 13a of the exposure mask 13 faces is dissolved to form a pattern such that the peripheral portion of the first thin metal film 3 is exposed.

The coating 12 formed in a pattern as shown in FIG. 4(c) is finally heated to 250° C. or higher to be cured (imidization), whereby the insulating base layer 7 formed of polyimide resin is formed as a pattern in such a way that the peripheral portion of the first thin metal film 3 is exposed (see FIG. 4(d)).

Next, as shown in FIG. 3(g), the conductive pattern 8 is formed into the wired circuit pattern described above by a known patterning method such as an additive method or a subtractive method.

When patterning is performed by, e.g., the additive method, a thin conductive film serving as an underplate is formed on the entire surface of the insulating base layer 7 by, e.g., a vacuum vapor deposition method or a sputtering method. Then, a plating resist having a pattern reverse to the wired circuit pattern is formed on a surface of the thin conductive film by exposing a dry film resist or the like to light and developing it. Subsequently, the conductive pattern 8 is formed as the wired circuit pattern on the surface of the portion of the thin conductive film exposed from the plating resist by plating. Then, the plating resist and the portion of the thin conductive film on which the plating resist is formed are removed by etching or the like. Plating may be either electrolytic plating or electroless plating. Preferably, electrolytic plating is used and, more preferably, electrolytic copper plating is used.

When patterning is performed by, e.g., the subtractive method, a conductor layer is first formed on the entire surface of the insulating base layer 7. The formation of the conductor layer is not particularly limited. For example, a conductor layer is bonded to the entire surface of the insulating base layer 7 via a known adhesive layer. Then, an etching resist having the same pattern as the wired circuit pattern is formed on a surface of the conductor layer by exposing a dry film resist or the like to light and developing it. Thereafter, the portion of the conductor layer exposed from the etching resist is etched (wet-etched) and then the etching resist is removed.

Next, as shown in FIG. 3(h), a solution of the synthetic resin mentioned above is uniformly applied to the surface of the insulating base layer 7 to cover the conductive pattern 8, dried, and then heated as necessary to be cured. As a result, the insulating cover layer 9 made of the synthetic resin is formed, whereby the wired circuit board 1 is obtained.

The insulating cover layer 9 can also be formed in a pattern by exposing a photosensitive synthetic resin to light and developing it. The formation of the insulating cover layer 9 is not particularly limited to the method described above. For example, it is also possible to preliminarily form the synthetic resin into a film and then bond the film to the surface of the insulating base layer 7 to cover the conductive pattern 8 with the film via a known adhesive layer.

The insulating cover layer 9 is formed such that the portions of the conductive pattern 8 which serve as terminal portions are exposed from the insulating cover layer 9, though they are not shown. To expose the portions of the conductive pattern 8 which serve as the terminal portions, the insulating cover layer 9 is formed in a pattern using the photosensitive synthetic resin mentioned above or perforated by a laser or punching.

The wired circuit board 1 shown in FIG. 1 may be produced by the method shown hereinafter, though not shown.

After the process as shown in FIG. 3(c), the resist 10 is removed by a known etching process, such as a chemical etching (wet etching), or by peeling.

The second thin metal film 6 is formed on the surface of the first thin metal film 3 to cover the entire surface (top and sides) of the ground layer 4 and the positioning mark layer 5.

The etching resist is formed on the (upper) surface of the second thin metal film 6 that are formed on the upper surface of each of the ground layer 4 and positioning mark layer 5. The second thin metal film 6 formed on the surface of the first thin metal film 3, and side surfaces of each of the ground layer 4 and the positioning mark layer 5 is removed by etching.

The etching resist is removed by a known etching process, such as a chemical etching (wet etching), or by peeling.

Thereafter, the wired circuit board 1 is obtained in the same manner in FIG. 3(f) to FIG. 3(h).

The wired circuit board 1 may be produced by the method mentioned above but not shown. However, the process of forming and removing the etching resist can be eliminated according to the method shown in FIG. 3, so that the total producing process can be reduced.

Figure 2:
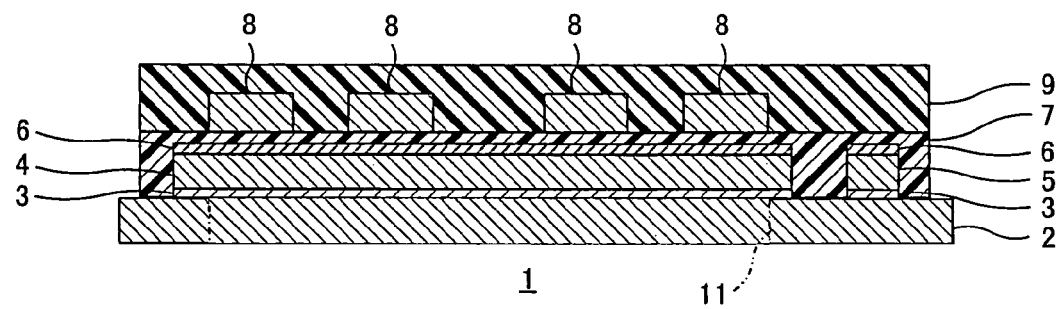
FIG. 2 is a sectional view of a principal portion of a wired circuit board of another embodiment of the present invention.

FIG. 2 is a sectional view of a principal portion of a wired circuit board of another embodiment of the present invention.

In the wired circuit board 1 shown in FIG. 2, the first metal thin film 3 exposed from the ground layer 4 and the positioning mark layer 5 is removed from the surface of the metal supporting board 2 of the wired circuit board 1 in FIG. 1.

In order to remove the first thin metal film 3 that is on the surface of the metal suspension board 2 and exposed from the ground layer 4 and the positioning mark layer 5 in the wired circuit board 1 as shown in FIG. 2, the first thin metal film 3 at the portion where the resist 10 is formed is removed together with the resist 10 by a known etching process, such as a chemical etching (wet etching), or by stripping.

In the wired circuit board 1 as shown in FIG. 2, the first thin metal film 3 and the second thin metal film 6 are formed of metals that are different from each other.

In the wired circuit board 1 thus obtained, the ground layer 4 is laminated on the metal supporting board 2 through the first metal thin film 3 interposed therebetween, as shown in FIG. 1 and FIG. 2. In the case where only the metal supporting board 2 is provided without the ground layer 4, a transmission loss in the conductive pattern 8 facing the metal supporting board 2 is undesirably increased. However, by thus interposing the ground layer 4 between the metal supporting board 2 and the conductive pattern 8, whereby the transmission loss in the conductive pattern 8 can be reduced.

In addition, in the wired circuit board 1 thus obtained, the insulating base layer 7 is laminated on the ground layer 4 and the positioning mark layer 5 through the second metal thin film 6 interposed therebetween, as shown in FIG. 1 or 2. In the case where the insulating base layer 7 is laminated directly on the ground layer 4 and the positioning mark layer 5, the ion migration phenomenon undesirably occurs between each of the ground layer 4 and the positioning mark layer 5 and the insulating base layer 7. However, by thus interposing the second metal thin film 6 between each of the ground layer 4 and the positioning mark layer 5 and the insulating base layer 7, the second metal thin film 6 serves as a barrier layer, whereby the occurrence of the ion migration phenomenon can be prevented.

Moreover, by interposing the second metal thin film 6 between each of the ground layer 4 and the positioning mark layer 5 and the insulating base layer 7, it is possible to sufficiently improve the adhesion between each of the ground layer 4 and the positioning mark layer 5 and the insulating base layer 7 as well as the conductivity of the conductive pattern 8 and ensure excellent long-term reliability with the simple layer structure. In particular, by forming each of the ground layer 4 and the positioning mark layer 5 of copper and forming the second metal thin film 6 of nickel, the adhesion between each of the ground layer 4 and the positioning mark layer 5 and the insulating base layer 7 and the conductivity of the conductive pattern 8 can be further improved.

In the case where the insulating base layer 7 formed on the first thin metal film 3 is formed to have a pattern using photosensitive resin, when the second thin metal film 6 is formed on the entire surface of the first thin metal film 3 to cover the entire surface of the ground layer 4 and the positioning mark layer 5, the surface of the positioning mark layer 5 and the surrounding surface are formed of the same second thin metal film 6. Therefore, it is difficult to provide a contrast that can be optically distinguished therebetween.

According to the method of producing the wired circuit board 1 of the present invention, however, first, the resist 10 is remained on the first thin metal film 3 while the second thin metal film 6 is formed only on the upper surface of the ground layer 4 and the positioning mark layer 5, and then the resist 10 is removed. Therefore, a contrast that can be optically distinguished between the second thin metal film 6 formed on the upper surface of the positioning mark layer 5 and the first thin metal film 3 exposed therearound. As a result, the positioning mark 5 can be accurately detected by an optical sensor and thus the insulating base layer 7 can be precisely formed.

In addition, even when the resist 10 is removed together with the first thin metal film 3 where the resist 10 is formed, as in the case with the wired circuit board 1 shown in FIG. 2, the optically distinguishable contrast can be still obtained between the second thin metal film 6 formed on the upper surface of the positioning mark layer 5 and the metal suspension board 2 exposed therearound. As a result, the positioning mark 5 can be accurately detected by an optical sensor and thus the insulating base layer 7 can be precisely formed.

To adjust the characteristic impedance of the wired circuit board 1, an opening 11 can also be formed in the metal supporting board 2 as necessary by etching the metal supporting board 2 and cutting it into a desired shape, as shown in FIGS. 1 and 2.

In the conventional wired circuit board, when the opening 11 is thus formed by etching in the metal supporting board 2, the ground layer 4 and the positioning mark layer 5 are also etched since they are laminated directly on the metal supporting board 2.

In the wired circuit board 1, however, the first metal thin film 3 is laminated on the metal supporting board 2 and the ground layer 4 and the positioning mark layer 5 are laminated on the first metal thin film 3. As a result, when the opening 11 is formed by etching in the metal supporting board 2, the first metal thin film 3 serves as a barrier layer, whereby the ground layer 4 and the positioning mark layer 5 from being etched can be prevented.

EXAMPLES

While in the following, the present invention is described in further detail with reference to Example and Comparative Examples, the present invention is not limited thereto.

Example 1

A chromium thin film with a thickness of 0.03 μm and a copper thin film with a thickness of 0.07 μm were successively formed by sputtering as a first metal thin film on a metal supporting board made of a stainless steel with a thickness of 25 μm (see FIG. 3(a)). A plating resist in a pattern reverse to those of a ground layer and a positioning mark layer was formed using a dry film resist (see FIG. 3(b)). Subsequently, a copper foil with a thickness of 4.0 μm was formed as a ground layer and a positioning mark layer on the entire surface of the portion of the first metal thin film exposed from the plating resist by electrolytic copper plating (see FIG. 3(c)). Thereafter, a nickel thin film with a thickness of 0.1 μm was formed as a second metal thin film over each surface of the ground layer and the positioning mark layer exposed from the plating resist by electroless plating (see FIG. 3(d)).

Then, the plating resist was removed by a chemical etching (Cf. FIG. 3(e)). After a varnish of a photosensitive polyamic resin was applied over the surface of the first thin metal film (Cf. FIG. 4(a)), the positioning mark layer 5 was detected by an optical sensor, and an exposure mask was provided over the applied varnish with reference to the positioning mark, and then subjected to exposure to light via the exposure mask (Cf. FIG. 4(b)), and development (Cf. FIG. 4(c)), and further cured by heat. As a result of this, an insulating base layer made of a polyimide resin with a thickness of 10 μm was formed in a pattern to cover the surface of the second thin metal film, and side surfaces of each of the ground layer and positioning mark layer. (Cf. FIG. 4(d) and FIG. 3(f)).

Then, a conductive pattern of copper with a thickness of 10 μm was formed in a wired circuit pattern on the insulating base layer by the additive process (Cf. FIG. 3(g). Further, after the varnish of the photosensitive polyamic resin was applied over the insulating base layer to cover the conductive pattern, thereby forming a coating, the coating was exposed to light and developed and further cured by heat. As a result of this, an insulating cover layer of a polyimide resin with a thickness of 5 μm was formed in a pattern to cover the entire surface of the conductive pattern (except terminal portions) (Cf. FIG. 3(h)). Then, after the terminal portions were plated with gold, the metal suspension board was cut into a desired shape by etching, whereby a suspension board with circuit was obtained.

Evaluation (Evaluation on Ion Migration Phenomenon)

The suspension boards with circuit obtained in Example 1 and was used for 1000 hours under conditions such that a temperature was 85° C., a humidity was 85%, and an applied voltage was 6 V. Thereafter, the presence of the ion migration phenomenon in which the copper of the ground layer and the positioning mark layer migrates to the surface of the polyimide resin of the insulating base layer or to the inner portion thereof was determined by resistivity. As a result, in Example 1, the second metal thin film served as the barrier layer, so that the ion migration phenomenon was not observed.

(Evaluation on Transmission Efficiency)

In the suspension boards with circuit obtained in Example 1, an output signal intensity ($P_{OUT}$) and an input signal intensity ($P_{IN}$) were measured and the transmission efficiency was evaluated as the ratio of the output signal intensity to the input signal intensity given by the following formula (1).

As a result, the transmission efficiency was 79% in Example 1.

$$\text{Transmission Efficiency (\%)} = P_{OUT}/P_{IN} \quad (1)$$

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a metal suspension board;
   a first thin metal film formed on the metal suspension board;
   a ground layer and a separate positioning mark layer formed on the first thin metal film, the positioning mark layer being formed on a surface of the first thin metal film at any portion except where the ground layer is formed;
   a second thin metal film formed on the ground layer and the positioning mark layer;
   an insulating layer formed on the second thin metal film; and
   a conductive pattern formed on the insulating layer.

2. The wired circuit board according to claim 1, wherein the ground layer and the positioning mark layer are formed of copper and the second thin metal film is formed of nickel.

3. The wired circuit board according to claim 1, wherein the positioning mark layer is disposed at one side end in a widthwise direction of the wired circuit board.

4. The wired circuit board according to claim 1, wherein the insulating layer is formed on the surface of the first thin metal film so as to cover top and side surfaces of the second thin metal film, and each side of the ground layer and the positioning mark layer.

* * * * *